United States Patent
Chen et al.

(10) Patent No.: US 9,998,227 B2
(45) Date of Patent: Jun. 12, 2018

(54) OPTICAL MODULE AND DETECTION CIRCUIT THEREOF

(71) Applicant: HUAWEI TECHNOLOGIES CO., LTD., Shenzhen (CN)

(72) Inventors: Weijian Chen, Shenzhen (CN); Yongzhong Wang, Shenzhen (CN)

(73) Assignee: HUAWEI TECHNOLOGIES CO., LTD., Shenzen (CN)

(*) Notice: Subject to any disclaimer, the term of this patent is extended or adjusted under 35 U.S.C. 154(b) by 52 days.

(21) Appl. No.: 14/059,750

(22) Filed: Oct. 22, 2013

(65) Prior Publication Data
US 2014/0119723 A1    May 1, 2014

(30) Foreign Application Priority Data
Oct. 24, 2012  (CN) .......................... 2012 1 0410394

(51) Int. Cl.
*H04B 10/00* (2013.01)
*H04B 10/50* (2013.01)
(Continued)

(52) U.S. Cl.
CPC ..... *H04B 10/50575* (2013.01); *H04B 10/588* (2013.01); *G01R 19/00* (2013.01)

(58) Field of Classification Search
CPC . H04B 10/50575; H04B 10/588; G01R 19/00
(Continued)

(56) References Cited

U.S. PATENT DOCUMENTS 4,298,163 A * 11/1981 Richardson ............. F23N 5/203
                                                        165/205
4,896,118 A * 1/1990 Johnson ........................... 330/2
(Continued)

FOREIGN PATENT DOCUMENTS

| CN | 101634590 A | 1/2010 |
| CN | 101908395   | 12/2010 |
| CN | 102195583   | 9/2011 |

OTHER PUBLICATIONS

Betts et al; Gain Limit in Analog links using Electroabsorption Modulators; Oct. 2006; IEEE; pp. 2065-2067.*
(Continued)

*Primary Examiner* — Amritbir Sandhu
(74) *Attorney, Agent, or Firm* — Staas & Halsey LLP

(57) ABSTRACT

The present invention discloses an optical module and a detection circuit thereof. The detection circuit includes: a sampling module, including a first potentiometer configured to convert a sampling current into a sampling voltage; an amplifying module, coupled to an output end of the sampling module and configured to amplify the sampling voltage; and an analog-to-digital conversion module, coupled to an output end of the amplifying module and configured to convert the amplified sampling voltage into a digital signal for detection. By arranging a potentiometer in a sampling module of a detection circuit, a resistance value of the sampling module can be adjusted, thereby adapting to responsivities of different modulators, increasing the locking speed of a modulator, preventing horizontal shifts of a locking point and a false locking point, and reducing the occupied PCB area.

17 Claims, 2 Drawing Sheets

(51) Int. Cl.
  *H04B 10/588* (2013.01)
  *G01R 19/00* (2006.01)
(58) Field of Classification Search
  USPC .......................... 330/108; 398/16, 193–198
  See application file for complete search history.

(56) References Cited

U.S. PATENT DOCUMENTS

| | | | |
|---|---|---|---|
| 5,017,756 A * | 5/1991 | Gilliland | B23K 9/1068 |
| | | | 219/130.32 |
| 5,056,097 A * | 10/1991 | Meyers | G01S 17/89 |
| | | | 250/492.1 |
| 5,343,324 A * | 8/1994 | Le | G02F 1/0123 |
| | | | 398/154 |
| 5,440,113 A * | 8/1995 | Morin et al. | 250/205 |
| 5,481,225 A * | 1/1996 | Lumsden | H03F 1/083 |
| | | | 330/254 |
| 5,495,359 A * | 2/1996 | Gertel | G02F 1/0123 |
| | | | 359/245 |
| 5,513,029 A * | 4/1996 | Roberts | 398/32 |
| 5,726,794 A * | 3/1998 | Tajima | 359/249 |
| 6,580,544 B1 | 6/2003 | Lin et al. | 359/239 |
| 6,836,622 B2 * | 12/2004 | Kobayashi et al. | 398/198 |
| 7,130,545 B2 | 10/2006 | Lou et al. | 398/198 |
| 7,174,099 B1 * | 2/2007 | Chinn et al. | 398/38 |
| 7,187,923 B2 * | 3/2007 | Mousseau | H04W 36/0066 |
| | | | 455/416 |
| 7,200,343 B2 * | 4/2007 | Ikeuchi | 398/198 |
| 7,369,290 B1 * | 5/2008 | Cox et al. | 359/239 |
| 7,414,234 B1 | 8/2008 | Teeter et al. | 250/214 R |
| 7,555,226 B2 * | 6/2009 | Tipper | 398/198 |
| 8,503,056 B2 * | 8/2013 | Schemmann et al. | 359/239 |
| 9,425,686 B2 * | 8/2016 | Zheng | H02M 1/44 |
| 2003/0112487 A1 * | 6/2003 | Fuller et al. | 359/239 |
| 2003/0185575 A1 * | 10/2003 | Ikeuchi | 398/197 |
| 2004/0033082 A1 * | 2/2004 | Sakamoto | H04B 10/25137 |
| | | | 398/198 |
| 2005/0238368 A1 * | 10/2005 | Ikeuchi et al. | 398/198 |
| 2006/0017607 A1 * | 1/2006 | Hayata | G01S 7/282 |
| | | | 342/41 |
| 2006/0098699 A1 * | 5/2006 | Sanchez | H01S 5/068 |
| | | | 372/26 |
| 2007/0058753 A1 * | 3/2007 | Saavedra | H03D 3/26 |
| | | | 375/329 |
| 2008/0061872 A1 * | 3/2008 | Hughes | H03F 3/45475 |
| | | | 330/86 |
| 2009/0091390 A1 * | 4/2009 | Hossack et al. | 330/277 |
| 2013/0230317 A1 * | 9/2013 | Ye | H04B 10/07955 |
| | | | 398/38 |
| 2014/0043012 A1 * | 2/2014 | Fischer | G01R 19/2509 |
| | | | 324/76.11 |
| 2014/0119723 A1 * | 5/2014 | Chen | H04B 10/50575 |
| | | | 398/16 |

OTHER PUBLICATIONS

Betts et al, Gain limit in Analog links using electroabsorption modulators, 2006, IEEE, pp. 2065-2067.*
G.E. Betts et al; Gain limit in Analog links using Electroabsorption Modulators; 2006; IEEE; pp. 2065-2067.*
Chinese Office Action dated Sep. 29, 2015 in corresponding Chinese Patent Application No. 201210410394.9.

* cited by examiner

OPTICAL MODULE AND DETECTION CIRCUIT THEREOF

CROSS-REFERENCE TO RELATED APPLICATIONS

This application claims priority to Chinese Patent Application No. 201210410394.9, filed on Oct. 24, 2012, which is hereby incorporated by reference in its entirety.

TECHNICAL FIELD

The application relates to the optical communication field, and in particular, to an optical module and a detection circuit thereof.

BACKGROUND

In optical communication, a transmitting end must send an optical carrier to a modulator for modulation to load data information to the optical carrier for transmission. However, the modulator is generally formed by simple optical components and is vulnerable to external environment changes, so that an output modulated signal is affected. To lessen external impacts on the modulator, a direct current bias point of the modulator must change as the external environment changes. Therefore, the signal at the output end of the modulator must be detected.

The prior art provides a detection circuit that converts a sampling current into a sampling voltage by using a sampling resistor and feeds back the sampling voltage to a modulator. When the external environment changes, the change is fed back to the modulator, so that the modulator changes as the external environment changes. However, there is a huge difference between responsivities of different modulators, which results in such poor effects as a low locking speed of the modulator, horizontal shifts of a locking point, and a false locking point.

The prior art also provides another detection circuit, where multiple sampling resistors are arranged and are selected by using a switch. In this case, although the adaptability to the responsivity of the modulator is increased, the detection circuit is very complex and occupies a large Printed Circuit Board (PCB) area, which is disadvantageous for miniaturization of instruments.

SUMMARY

A technical problem that the application mainly solves is to provide an optical module and a detection circuit thereof, which can adapt to responsivities of different modulators and reduce the occupied PCB area.

To solve the above technical problem, one aspect of the application provides a detection circuit, including: a sampling module, including a first potentiometer, where the first potentiometer configured to convert a sampling current into a sampling voltage; an amplifying module, coupled to an output end of the sampling module and configured to amplify the sampling voltage; and an analog-to-digital conversion module, coupled to an output end of the amplifying module and configured to convert the amplified sampling voltage into a digital signal for detection.

The sampling module further includes a sampling resistor, where the sampling resistor and the first potentiometer form a resistance network.

The amplifying module includes a second potentiometer, where the second potentiometer is configured to adjust an amplification coefficient of the amplifying module.

The amplifying module further includes a feedback amplification resistor, where the second potentiometer and the feedback amplification resistor form a resistance network.

The first potentiometer or the second potentiometer is a mechanically adjustable potentiometer.

Alternatively, the first potentiometer or the second potentiometer is a digital potentiometer.

A resistance value of the digital potentiometer is adjusted by using a microcontroller or a communication bus.

To solve the above technical problem, another aspect of the application also provides an optical module, including an optical source, a modulator, a driver module, an amplification control module, a processor, and a bias voltage control module, where the optical source is optically coupled to the modulator to output an optical carrier to the modulator; the driver module outputs an electrical signal to the modulator; the modulator modulates the optical carrier according to the electrical signal to obtain a modulated signal; the amplification control module samples and amplifies the modulated signal to obtain a sampling voltage and feeds back the sampling voltage to the processor; the processor controls, according to the sampling voltage, the bias voltage control module to perform locking; and the amplification control module includes the foregoing detection circuit.

The processor or an external memory is configured to store a mapping table between resistance values of the first potentiometer and the second potentiometer and a responsivity of the modulator.

Alternatively, the processor is further configured to compute a relationship between resistance values of the first potentiometer and the second potentiometer and a responsivity of the modulator.

The processor is further configured to perform digital filtering, integration processing and bias voltage locking processing on the sampling voltage.

As can be known from above, by arranging a potentiometer in a sampling module of a detection circuit, a resistance value of the sampling module can be adjusted, thereby adapting to responsivities of different modulators, increasing the locking speed of a modulator, preventing horizontal shifts of a locking point and a false locking point, and reducing the occupied PCB area.

DESCRIPTION OF EMBODIMENTS

For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

Figure 1:
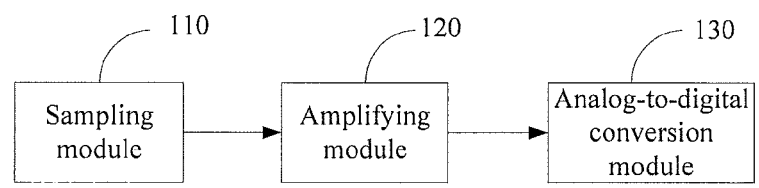
FIG. 1 is a schematic structural diagram of an embodiment of a detection circuit according to the application.

Referring to FIG. 1, FIG. 1 is a schematic structural diagram of an embodiment of a detection circuit according to the application. The detection circuit in this embodiment includes a sampling module 110, an amplifying module 120, and an analog-to-digital conversion module 130. An output end of the sampling module 110 is coupled to an input end of the amplifying module 120, and an output end of the amplifying module 120 is coupled to the analog-to-digital conversion module 130.

The sampling module 110 includes a first potentiometer (not shown in the figure), where the first potentiometer is configured to convert a sampling current into a sampling voltage.

The amplifying module 120 is configured to amplify the sampling voltage.

The analog-to-digital conversion module 130 is configured to convert the amplified sampling voltage into a digital signal for detection.

By arranging a potentiometer in a sampling module of a detection circuit, a resistance value of the sampling module can be adjusted, thereby adapting to responsivities of different modulators, increasing the locking speed of a modulator, preventing horizontal shifts of a locking point and a false locking point, and reducing the occupied PCB area.

Figure 2:
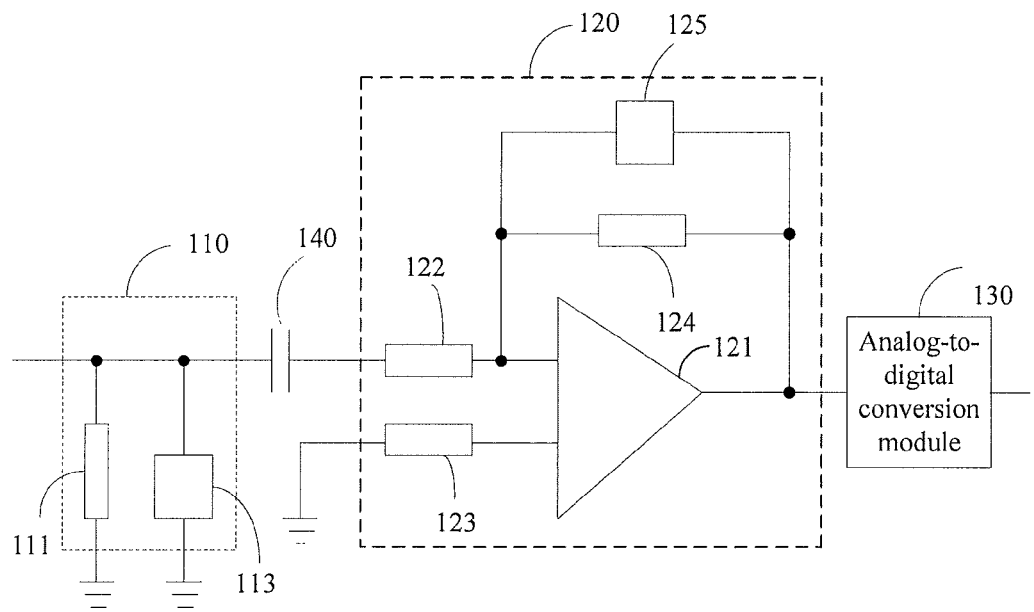
FIG. 2 is a circuit diagram of a specific embodiment of the detection circuit illustrated in FIG. 1.

Referring to FIG. 2, FIG. 2 is a circuit diagram of a specific embodiment of the detection circuit illustrated in FIG. 1. The circuit diagram in this embodiment includes a sampling module 110, an amplifying module 120, and an analog-to-digital conversion module 130. The sampling module 110 includes a sampling resistor 111 and a first potentiometer 113, where the sampling resistor 111 and the first potentiometer 113 form a resistance network. The amplifying module 120 includes an amplifier 121, a first input resistor 122, a second input resistor 123, a feedback amplification resistor 124, and a second potentiometer 125, where the second potentiometer 125 and the feedback amplification resistor 124 form a resistance network.

One end of the sampling resistor 111 is configured to input a voltage, and the other end of the sampling resistor 111 is grounded. One end of the sampling resistor 111 is coupled to one end of the first potentiometer 113, and the other end of the first potentiometer 113 is grounded. A common end of the sampling resistor 111 and the first potentiometer 113 is coupled to one end of a capacitor 140, and the other end of the capacitor 140 is coupled to one end of the first input resistor 122; the other end of the first input resistor 122 is coupled to a positive input end of the amplifier 121; one end of the second input resistor 123 is grounded, and the other end of the second input resistor 123 is coupled to a negative input end of the amplifier 121; an output end of the amplifier 121 is coupled to one end of the feedback amplification resistor 124, and the other end of the feedback amplification resistor 124 is coupled to a common end of the first input resistor 122 and the positive input end of the amplifier 121; one end of the second potentiometer 125 is coupled to the output end of the amplifier 121, and the other end of the second potentiometer 125 is coupled to the common end of the first input resistor 122 and the positive input end of the amplifier 121; and the output end of the amplifier 121 is coupled to the analog-to-digital conversion module 130.

In operation, the sampling resistor 111 and the first potentiometer 113 convert an input sampling current into a sampling voltage, and input the sampling voltage to the positive input end of the amplifier 121 through the capacitor 140 and the first input resistor 122; and the amplifier 121 amplifies the input sampling voltage. The voltage at the output end of the amplifier 121 is as follows:

$$V_o = -\frac{R_f}{\left(\frac{R_f}{R_x}+1\right)R_1}V_s$$

where, $V_o$ indicates the voltage output by the amplifier 121, $R_f$ indicates a resistance value of the feedback amplification resistor 124, $R_x$ indicates a resistance value of the second potentiometer 125, $R_1$ indicates a resistance value of the first input resistor 122, and $V_s$ indicates a voltage value of the input sampling voltage. Therefore, when the resistance value of the second potentiometer 125 is adjusted, the amplification coefficient of the amplifier 121 may be adjusted. The amplified sampling voltage output by the amplifier 121 is input to the analog-to-digital conversion module 130 to convert an analog sampling voltage into a digital signal.

There is a huge difference between responsivities of different modulators, for example, the difference between responsivities of some products ranges from 40 mA/W to 400 mA/W, while the difference between responsivities of some products ranges from 15 mA/W to 75 mA/W. Therefore, to ensure that the voltage output by the detection circuit is within the responsivity range of the modulator, the resistance value of the first potentiometer 113 may be adjusted; if the responsivity of the modulator is too large, the resistance value of the first potentiometer 113 may be reduced to decrease the resistance value of the sampling module 110; if the responsivity of the modulator is too small, the resistance value of the first potentiometer 113 may be raised to increase the resistance value of the sampling module 110, so that the converted voltage is within a proper range. In addition, the resistance value of the second potentiometer 125 may also be adjusted to adjust the amplification coefficient of the amplifier 121, so that the converted voltage is within a proper range.

By arranging the first potentiometer 113 in the sampling module 110 of the detection circuit, the resistance value of the sampling module 110 can be adjusted, thereby adapting to responsivities of different modulators, increasing the locking speed of a modulator, preventing horizontal shifts of a locking point and a false locking point, and reducing the occupied PCB area. In addition, the second potentiometer 125 can be used to adjust the amplification coefficient of the amplifier 121, thereby enhancing the flexibility of signal amplification.

The first potentiometer 113 or the second potentiometer 125 may be a mechanically adjustable potentiometer or a digital potentiometer. When the first potentiometer 113 or the second potentiometer 125 is a digital potentiometer, the resistance value of the first potentiometer 113 or the second potentiometer 125 is adjusted by using a microcontroller or a communication bus.

Figure 3:
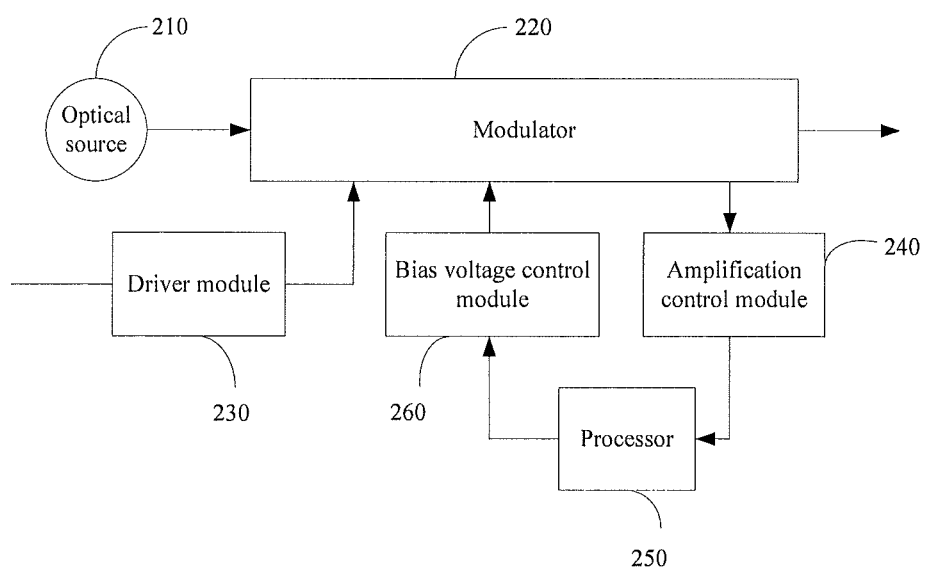
FIG. 3 is a schematic structural diagram of an embodiment of an optical module according to the application.

Referring to FIG. 3, FIG. 3 is a schematic structural diagram of an embodiment of an optical module according to the application. The optical module in this embodiment includes an optical source 210, a modulator 220, a driver module 230, an amplification control module 240, a processor 250, and a bias voltage control module 260.

The optical source 210 is optically coupled to a first input end of the modulator 220; the driver module 230 is coupled to a second input end of the modulator 220; one end of the amplification control module 240 is coupled to a feedback output end of the modulator 220, and the other end of the amplification control module 240 is coupled to one end of the processor 250; the other end of the processor 250 is coupled to one end of the bias voltage control module 260, and the other end of the bias voltage control module 260 is coupled to a feedback input end of the modulator 220.

The optical source 210 includes at least one light emitting diode and is configured to transmit an optical carrier to the modulator 220. The driver module 230 is configured to amplify an electrical signal, and input the electrical signal to the modulator 220. The modulator 220 modulates, according to the electrical signal output by the driver module 230, the optical carrier output by the optical source 210 to obtain a modulated signal, so as to modulate data onto the optical carrier for data transmission, where the electrical signal carries data information.

A direct current bias point of the modulator 220 needs to be controlled by using a feedback loop. The amplification control module 240 samples and amplifies the modulated signal output by the modulator 220 to obtain a sampling voltage, and then inputs the sampling voltage to the processor 250 for digital filtering and integration processing to obtain a direction and magnitude of locking adjustment; and the bias voltage control module 260 performs bias voltage locking processing on the sampling voltage. The amplification control module 240 includes the detection circuit as described in the foregoing embodiments.

The processor 250 is further configured to store a mapping table between resistance values of the first potentiometer and the second potentiometer and a responsivity of the modulator 220. By looking up the table, related parameters may be quickly found, and thereby commissioning efficiency is increased. The mapping table between the resistance values of the first potentiometer and the second potentiometer and the responsivity of the modulator 220 may also be stored in an external memory, and the processor 250 reads the mapping table from the external memory.

In other embodiments, the mapping table between the resistance values of the first potentiometer and the second potentiometer and the responsivity of the modulator 220 may not be stored; each time when the resistance values of the first potentiometer and the second potentiometer are obtained, the processor computes the relationship between the resistance values of the first potentiometer and the second potentiometer and the responsivity of the modulator 220.

By arranging a potentiometer in a sampling module of a detection circuit, a resistance value of the sampling module can be adjusted, thereby adapting to responsivities of different modulators, increasing the locking speed of a modulator, preventing horizontal shifts of a locking point and a false locking point, and reducing the occupied PCB area.

In the several embodiments provided in the application, it should be understood that the disclosed system, apparatus, and method may be implemented in other manners. For example, the described apparatus embodiment is merely exemplary. For example, the division of the modules or units is merely logical function division and may be other division in actual implementation. For example, multiple units or components may be combined or integrated in another system, or some features may be ignored or not be executed. Furthermore, the displayed or discussed mutual couplings or direct couplings or communication connections may be implemented through some interfaces. The indirect couplings or communication connections between the apparatuses or units may be implemented in electrical, mechanical, or other forms.

The units that are described as separate parts may or may not be physically separate. The parts that are displayed as units may or may not be physical units, that is, may be located in one position or distributed on multiple network elements. A part or all of the units may be selected according to the actual need to achieve the objectives of the solutions of the embodiments.

In addition, functional units in the embodiments of the application may be integrated into one processing unit, or each of the units may exist alone physically, or two or more units are integrated into one unit.

What is claimed is:

1. A detection circuit for a modulator, comprising:
a sampling resistor and a first potentiometer, one end of the sampling resistor coupled to one end of the first potentiometer, the one end of the sampling resistor configured to input a voltage to provide a sampling current to the one end of the first potentiometer, and an other end of the sampling resistor and an other end of the first potentiometer being grounded,
the first potentiometer configured to convert the sampling current into a sampling voltage according to a responsivity of the modulator;
an amplifier configured to amplify the sampling voltage; and
an analog-to-digital converter coupled to an output end of the amplifier, the analog-to-digital converter configured to convert the amplified sampling voltage into a digital signal for detection,
wherein to convert the sampling current into the sampling voltage, a resistance value of the first potentiometer is adjustable by being decreased or increased to correspond to the responsivity of the modulator.

2. The detection circuit according to claim 1, wherein the sampling resistor and the first potentiometer form a first resistance network.

3. The detection circuit according to claim 2, wherein the amplifier comprises a second potentiometer configured to adjust an amplification coefficient of the amplifier.

4. The detection circuit according to claim 3, wherein the amplifier further comprises a feedback amplification resistor, and the second potentiometer and the feedback amplification resistor form a second resistance network.

5. The detection circuit according to claim 3, wherein the first potentiometer or the second potentiometer is a mechanically adjustable potentiometer.

6. The detection circuit according to claim 3, wherein the first potentiometer or the second potentiometer is a digital potentiometer.

7. The detection circuit according to claim 6, wherein a resistance value of the digital potentiometer is adjusted by using a microcontroller or a communication bus.

8. An optical device, comprising:
a modulator;
a driver configured to output an electrical signal to the modulator;
an amplification controller including a detection circuit;
a processor;
a bias voltage controller; and
an optical source optically coupled to the modulator to output an optical carrier to the modulator;
wherein,
the modulator modulates the optical carrier according to the electrical signal to obtain a modulated signal,
the amplification controller samples and amplifies the modulated signal to obtain a sampling voltage and feeds back the sampling voltage to the processor,
the processor controls, according to the sampling voltage, the bias voltage controller to perform locking, and the detection circuit to sample and amplify the modulated signal to obtain the sampling voltage comprises:
a sampling resistor and a first potentiometer, one end of the sampling resistor coupled to one end of the first potentiometer, the one end of the sampling resistor configured to input a voltage to provide a sampling current to the one end of the first potentiometer, and an other end of the sampling resistor and an other end of the first potentiometer being grounded,
the first potentiometer configured to convert the sampling current into the sampling voltage according to a responsivity of the modulator;
an amplifier configured to amplify the sampling voltage; and
an analog-to-digital converter coupled to an output end of the amplifier, the analog-to-digital converter configured to convert the amplified sampling voltage into a digital signal for detection,
wherein to convert the sampling current into the sampling voltage, a resistance value of the first potentiometer is adjustable by being decreased or increased to correspond to the responsivity of the modulator.

9. The optical device according to claim 8, wherein the sampling resistor and the first potentiometer form a first resistance network.

10. The optical device according to claim 8, wherein the amplifier comprises a second potentiometer, to adjust an amplification coefficient of the amplifier.

11. The optical device according to claim 10, wherein the amplifier further comprises a feedback amplification resistor, and the second potentiometer and the feedback amplification resistor form a second resistance network.

12. The optical device according to claim 10, wherein the first potentiometer or the second potentiometer is a mechanically adjustable potentiometer.

13. The optical device according to claim 10, wherein the first potentiometer or the second potentiometer is a digital potentiometer.

14. The optical device according to claim 13, wherein a resistance value of the digital potentiometer is adjusted by using any one or combination of a microcontroller, a communication bus, or the processor.

15. The optical device according to claim 10, wherein the processor or an external memory is configured to store a mapping table between resistance values of the first potentiometer and the second potentiometer and the responsivity of the modulator.

16. The optical device according to claim 10, wherein the processor is further configured to compute a relationship between resistance values of the first potentiometer and the second potentiometer and the responsivity of the modulator.

17. The optical device according to claim 10, wherein the processor is further configured to perform digital filtering, integration processing and bias voltage locking processing on the sampling voltage.

* * * * *

UNITED STATES PATENT AND TRADEMARK OFFICE
CERTIFICATE OF CORRECTION

PATENT NO. : 9,998,227 B2
APPLICATION NO. : 14/059750
DATED : June 12, 2018
INVENTOR(S) : Weijian Chen et al.

It is certified that error appears in the above-identified patent and that said Letters Patent is hereby corrected as shown below:

On the Title Page

Item [73] (Assignee):
Delete "Shenzen (CN)" and insert -- Shenzhen (CN) --, therefore.

Signed and Sealed this
Twenty-sixth Day of November, 2019

Andrei Iancu
*Director of the United States Patent and Trademark Office*